United States Patent
Hey et al.

[11] Patent Number: 6,022,587
[45] Date of Patent: *Feb. 8, 2000

[54] METHOD AND APPARATUS FOR IMPROVING FILM DEPOSITION UNIFORMITY ON A SUBSTRATE

[75] Inventors: H. Peter W. Hey, Sunnyvale; Vedapuram S. Achutharaman, Santa Clara; Johanes F. N. Swenberg, Los Gatos, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/855,247

[22] Filed: May 13, 1997

[51] Int. Cl.[7] .................................................. C23C 16/42
[52] U.S. Cl. .................................. 427/248.1; 427/255.27; 427/255.28; 427/255.391; 427/255.395; 427/255.4; 427/255.7
[58] Field of Search ................................ 427/248.1, 255, 427/255.2, 255.4, 255.7, 255.21, 255.28, 255.391, 255.395

[56] References Cited

U.S. PATENT DOCUMENTS

| | | | |
|---|---|---|---|
| 4,619,038 | 10/1986 | Pintchovski | 29/590 |
| 4,650,698 | 3/1987 | Moriya et al. | 427/255.2 |
| 4,668,530 | 5/1987 | Reif et al. | 427/255.2 |
| 4,923,715 | 5/1990 | Matsuda et al. | 427/237 |
| 5,091,219 | 2/1992 | Monowski et a. | 427/255.5 |
| 5,421,957 | 6/1995 | Carlson et al. | 216/58 |

OTHER PUBLICATIONS

Pierson, Handbook of Chemical Vapor Deposition, Noyes Publications, Park Ridge, New Jersey, pp. 246–247 (no month), 1992.

*Primary Examiner*—Timothy Meeks
*Attorney, Agent, or Firm*—Blakely Sokoloff Taylor & Zafman

[57] ABSTRACT

A method and apparatus for depositing a film on a substrate. According to the present invention a prewafer reaction layer is deposited onto a susceptor placed in the reaction chamber to form a prewafer reaction layer coated susceptor prior to film deposition. A deposition gas is then fed into the reaction chamber so that it flows over the prewafer reaction layer coated susceptor and the substrate to form a film on the prewafer reaction layer coated susceptor and the substrate.

20 Claims, 7 Drawing Sheets

METHOD AND APPARATUS FOR IMPROVING FILM DEPOSITION UNIFORMITY ON A SUBSTRATE

BACKGROUND OF THE INVENTION

1. Field of the Invention

The present invention relates to the field of semiconductor manufacturing, and more specifically to a method and apparatus for uniformly depositing a thin film on a substrate.

2. Discussion of Related Art

Semiconductor devices are made up of literally millions of discreet devices which are interconnected together to form functional circuits, such as microprocessors, memories and programmable logic devices. In order to improve circuit performance, the fabrication processes generally utilize low resistance metal films such as suicides to form low resistance gate electrodes, contact regions, capacitor electrodes and interconnection lines. Silicide films, such as titanium silicide, can be formed by chemical vapor deposition (CVD) processes.

FIG. 1 is an illustration of a current CVD apparatus which can be used to deposit a titanium silicide film on a semiconductor wafer or substrate. A susceptor 120 divides a chamber 112 into one portion which is below the susceptor 124 and a second portion which is above the susceptor 122. The susceptor 120 is generally mounted on a shaft 126 which rotates the susceptor about its center to achieve a more uniform processing of the wafer. A flow of processing gas such as deposition gas 115 is provided into the upper portion 122 of the chamber. The chamber generally has a gas inlet 178 at one side thereof and a gas exhaust passage 116 at the opposite side to achieve a flow of processing gas across the wafer. The susceptor 120 is heated in order to heat the wafer to a desired deposition temperature. One method to heat the susceptor is by the use of lamps 134 provided around the chamber and directing the light into the chamber and onto the susceptor 120.

In a method of depositing titanium silicide on a wafer, a deposition gas 115 containing titanium chloride ($TiCl_4$) and a silicon source gas, such as $SiH_4$, is fed into the reaction chamber 112. As deposition gas is fed into the chamber, it is heated by preheat ring 128 and susceptor 120 and reacts to form titanium silicide. Titanium silicide will only form or deposit on those areas of a wafer (or chamber) which will react with titanium silicide under deposition conditions. That is, titanium silicide will only form on silicon areas of the wafer such as doped and undoped polycrystalline and amorphous silicon, the silicon substrate, and silicide layers, etc. and will not form or deposit on areas which are not silicon such as insulated layers including silicon dioxide ($SiO_2$) and silicon nitride ($Si_3N_4$) and susceptor 120 which is generally made of silicon carbide.

A problem with depositing titanium silicide by the process and apparatus described above is that the film deposition rate is non uniform across the surface of the wafer. The first silicon containing areas 131 (i.e., reaction areas) encountered by the deposition gas 115 experience a significantly higher deposition rate than do subsequent reaction areas. As such, as illustrated in FIG. 1b, much more titanium silicide is deposited onto the edge 131 of the wafer adjacent to the gas inlet than is deposited onto the center of the wafer or onto the opposite side of the wafer. The enhanced deposition rate associated with initial reaction areas is sometimes referred to as "edge effects". Edge effects substantially reduce film thickness uniformity and can make a process entirely unmanufacturable.

Thus, what is desired is a method and apparatus for reducing edge effects in a deposition process.

SUMMARY OF THE INVENTION

A method and apparatus for depositing a film on a substrate is described. According to an embodiment of the present invention a prewafer reaction layer is formed adjacent to a wafer prior to film deposition. Deposition gas is then fed into the reaction chamber so that it flows over the prewafer reaction layer and the substrate to deposit film on the prewafer reaction layer and the substrate.

BRIEF DESCRIPTION OF THE DRAWINGS

FIG. 1b is an illustration of non uniform deposition that can occur in the deposition chamber of FIG. 1a.

DETAILED DESCRIPTION OF THE PRESENT INVENTION

The present invention is a method and apparatus for uniformly depositing a film on a substrate. In the following description numerous specific details such as specific materials, gasses and processes have been described in order to provide a thorough understanding of the present invention. In other instances well known semiconductor equipment and manufacturing processes have not been given in detail in order to not unnecessarily obscure the present invention.

The present invention is a technique for improving the thickness uniformity of a film formed by chemical vapor deposition (CVD). According to the present invention a prewafer reaction layer is formed adjacent to a wafer prior to film deposition. The prewafer reaction layer provides an initial reaction surface for deposition gasses as they enter the reaction chamber so that initial film growth occurs on the prereaction surface as opposed to the wafer edge. By providing an initial reaction surface, the increased deposition rate associated with initial reaction surfaces occurs on the prewafer reaction layer as opposed to on the edge of the wafer. In this way "edge effects" are substantially reduced and film thickness uniformity across a wafer and from wafer to wafer substantially improved.

In one embodiment of the present invention a silicide layer is selectively deposited onto silicon containing portions of a substrate. According to the selective silicide deposition process, a susceptor is first coated with a prewafer reaction layer of silicon or a silicide, and then a wafer is placed on the prewafer reaction layer coated susceptor. A deposition gas is then fed into the chamber in such a way that the deposition gas first reacts with the prewafer reaction layer on the susceptor and then reacts with the substrate. In another embodiment of the present invention a silicide layer is blanket deposited over a substrate utilizing an integrated deposition process. According to the integrated deposition process of the present invention, a wafer is placed on a susceptor and then a silicon layer is blanket deposited onto the wafer and onto the susceptor. Deposition gas then fed into the chamber where it initially reacts with the silicon on the susceptor and then reacts with silicon on the wafer. Both techniques are effective at reducing deposition "edge effects" thereby enabling uniform silicide deposition to occur.

Figure 1A:
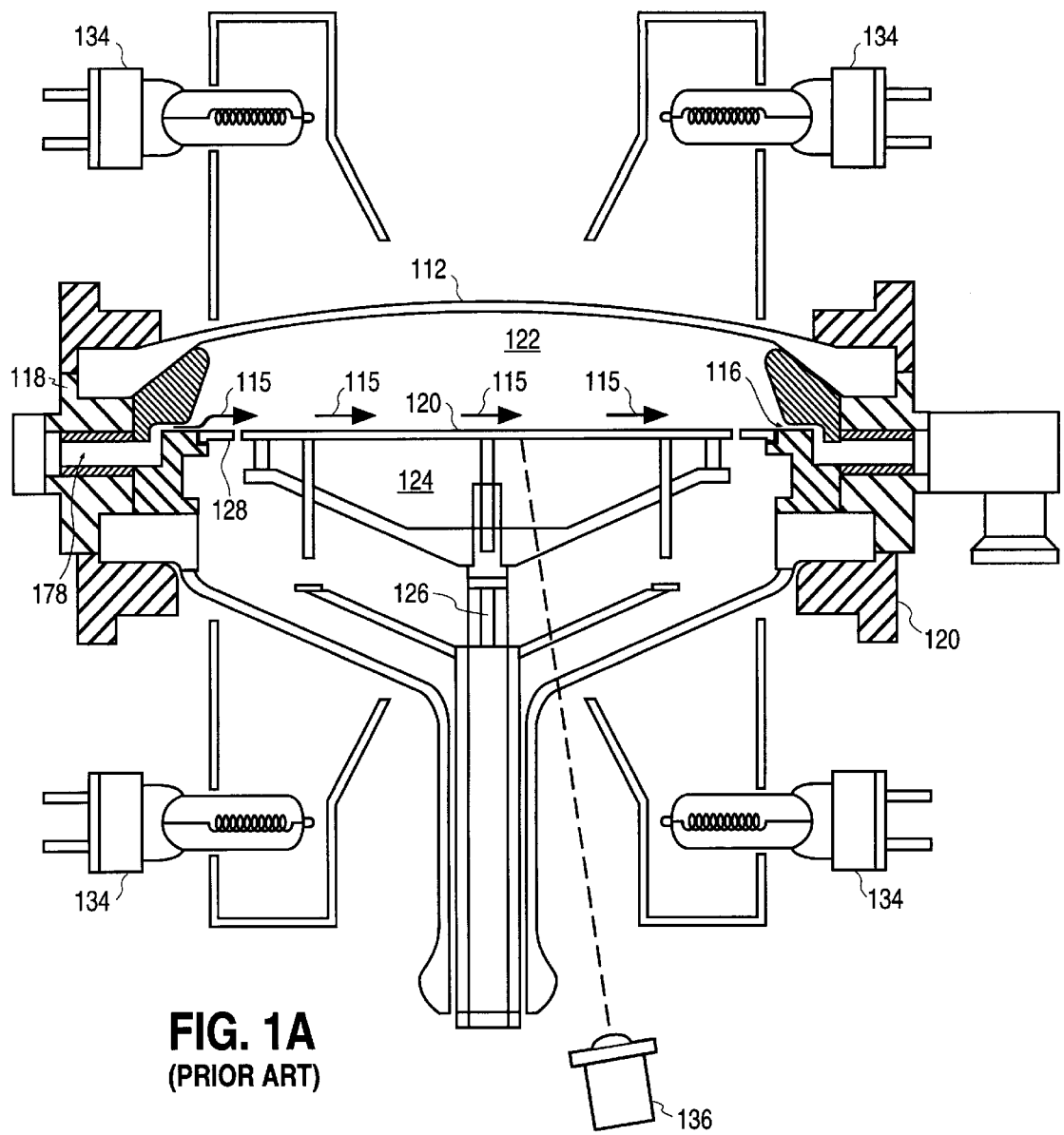
FIG. 1a is an illustration of a cross-sectional view of a deposition chamber.
Figure 1B:
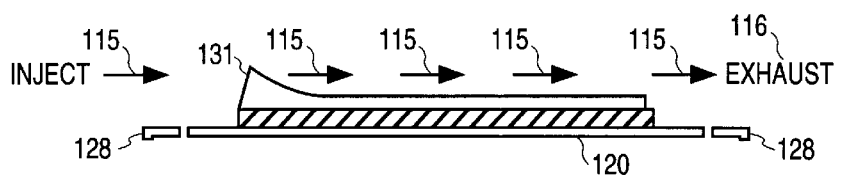
Figure 2:
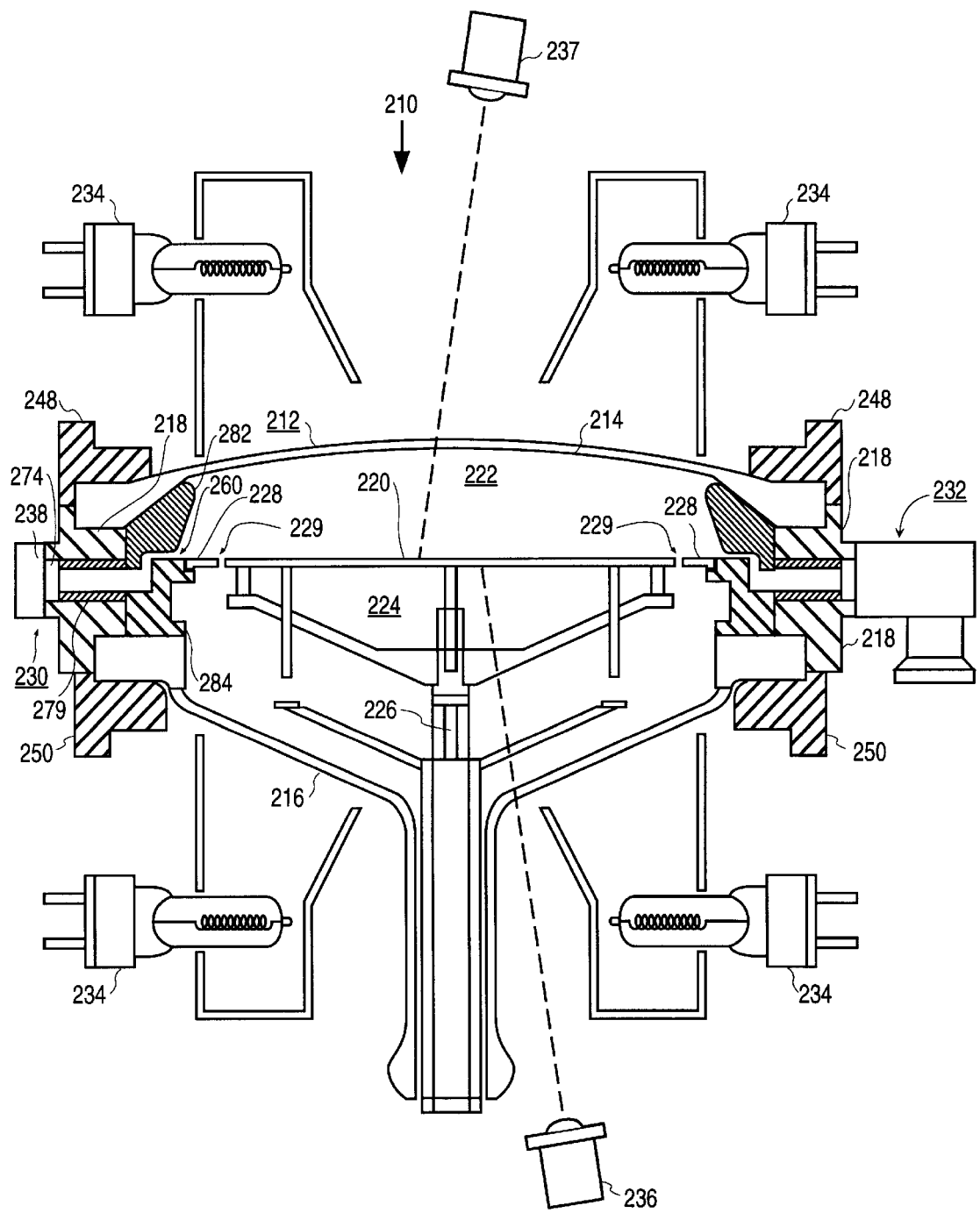
FIG. 2 is an illustration of a Chemical Vapor Deposition (CVD) chamber which can be utilized in the present invention.

A chemical vapor deposition apparatus 210 which can be used in accordance with the present invention is shown on FIG. 2. The deposition apparatus 210 comprises a deposition chamber 212 having an upper dome 214, a lower dome 216 and a side wall 218 between the upper and lower domes 214 and 216. An upper liner 282 and a lower liner 284 are mounted against the inside surface of sidewall 218. The upper and lower domes 214 and 216 are made of a transparent material to allow heating light to pass there through into the chamber 212.

Within the chamber 212 is a flat, circular susceptor 220 for supporting a wafer. The susceptor 220 extends transversely across the chamber 212 at the side wall 218 to divide the chamber 212 into an upper portion 222 above the susceptor 220 and a lower portion 224 below the susceptor 220. The susceptor 220 is mounted on a shaft 226 which extends perpendicularly downwardly from the center of the bottom of the susceptor 220. The shaft 226 is connected to a motor (not shown) which rotates shaft 226 and thereby rotates the susceptor 220. An annular preheat ring 228 is connected at its outer periphery to the inside periphery of lower liner 284 and extends around the susceptor 220. The preheat ring 228 is in the same plane as the susceptor 220 with the inner edge of the preheat ring 228 separated by a gap 229 from the outer edge of the susceptor 220. An inlet manifold 230 is positioned in the side of chamber 212 and is adapted to admit gas into the chamber 212. An outlet port 232 is positioned in the side of chamber 212 diagonally opposite the inlet manifold and is adapted to exhaust gases from the deposition chamber 212.

A plurality of high intensity lamps 234 are mounted around the chamber 212 and direct their light through the upper and lower domes 214 and 216 onto the susceptor 220 to heat the susceptor 220. The upper and lower domes 214 and 216 are made of a material which is transparent to the light from the lamps 234, such as clear quartz. The upper and lower domes 214 and 216 are generally made of quartz because quartz is transparent to light of both visible and IR frequencies; it exhibits a relatively high structural strength; and it is chemically stable in the process environment of the deposition chamber 212. Although IR frequency lamps are the preferred means for heating wafers and in deposition chamber 220, other methods may be used such as resistance heaters and RF inductive heaters. Preheat ring 228 and susceptor 220 are made of a material, such as silicon carbide or silicon carbide coated graphite, which is opaque to the radiation frequency of the lamps so that they can be heated by lamps 234. Preheat ring 228 and susceptor 220 are made of a material which is substantially unreactive with deposition gas used to deposit a film according to the present invention.

An infrared temperature sensor 236 such as a pyrometer is mounted below the lower dome 216 and faces the bottom surface of the susceptor 220 through the lower dome 216. The temperature sensor 236, is used to monitor the temperature of the susceptor 220 by receiving infra-red radiation emitted from the susceptor 220 when the susceptor 220 is heated. A temperature sensor 237 for measuring the temperature of a wafer may also be included if desired.

An upper clamping ring 248 extends around the periphery of the outer surface of the upper domes 214. A lower clamping ring 250 extends around the periphery of the outer surface of the lower dome 216. The upper and lower clamping rings are secured together so as to clamp the upper and lower domes 214 and 216 to the side wall 218.

Reactor 210 includes a deposition gas inlet manifold 230 for feeding deposition gas into chamber 212 deposition. Gas inlet manifold 230 includes a baffle 274, an insert plate 279 positioned within sidewall 218, and a passage 260 formed between upper liner 282 and lower liner 284. Passage 260 is connected to the upper portion 222 of chamber 212. Deposition gas are fed from gas cap 238 through baffle 274, insert plate 279 and passage 260 and into the upper portion 222 of chamber 212.

Figure 3:
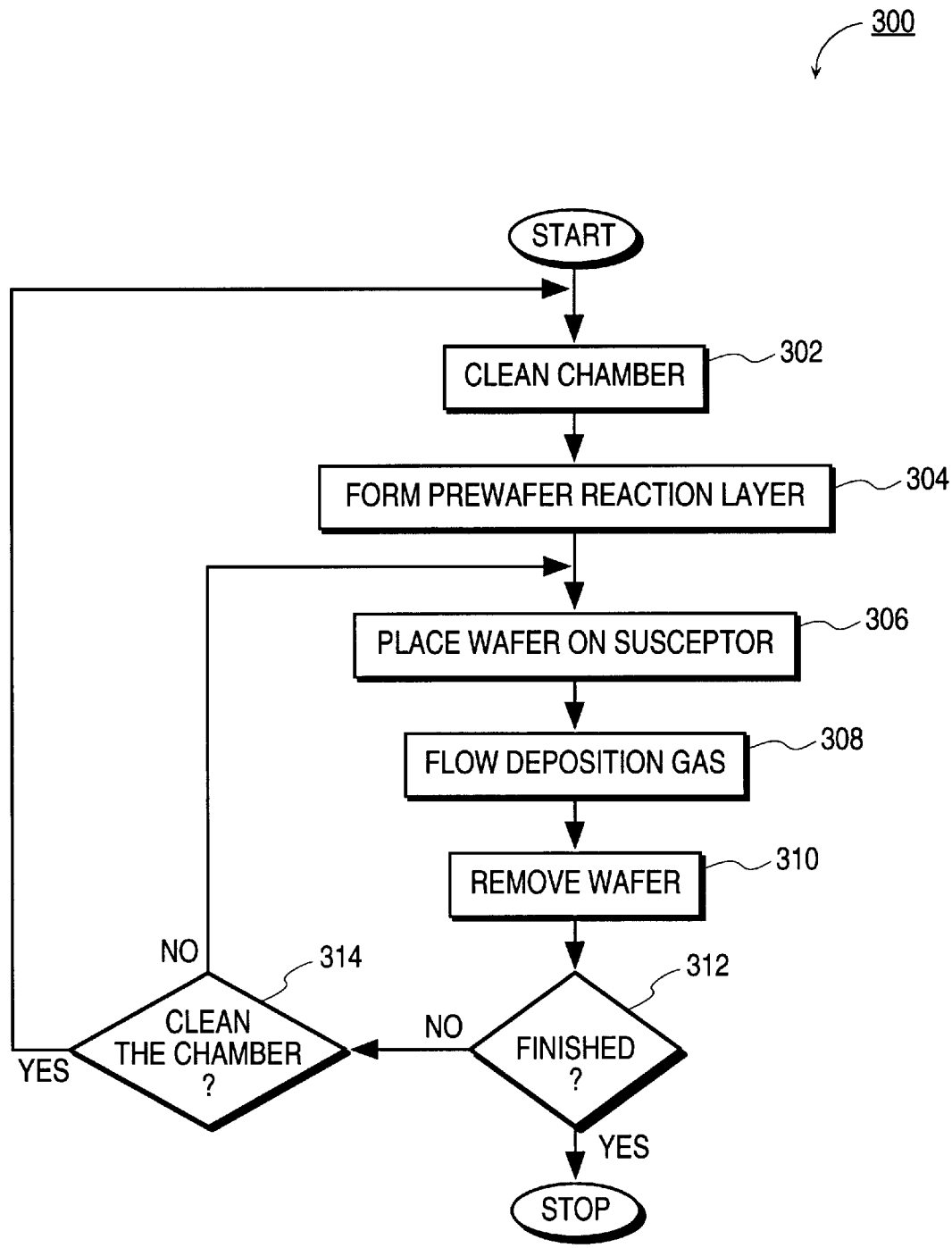
FIG. 3 is a flow chart which illustrates a selective silicide deposition process in accordance with the present invention.
Figure 5A:
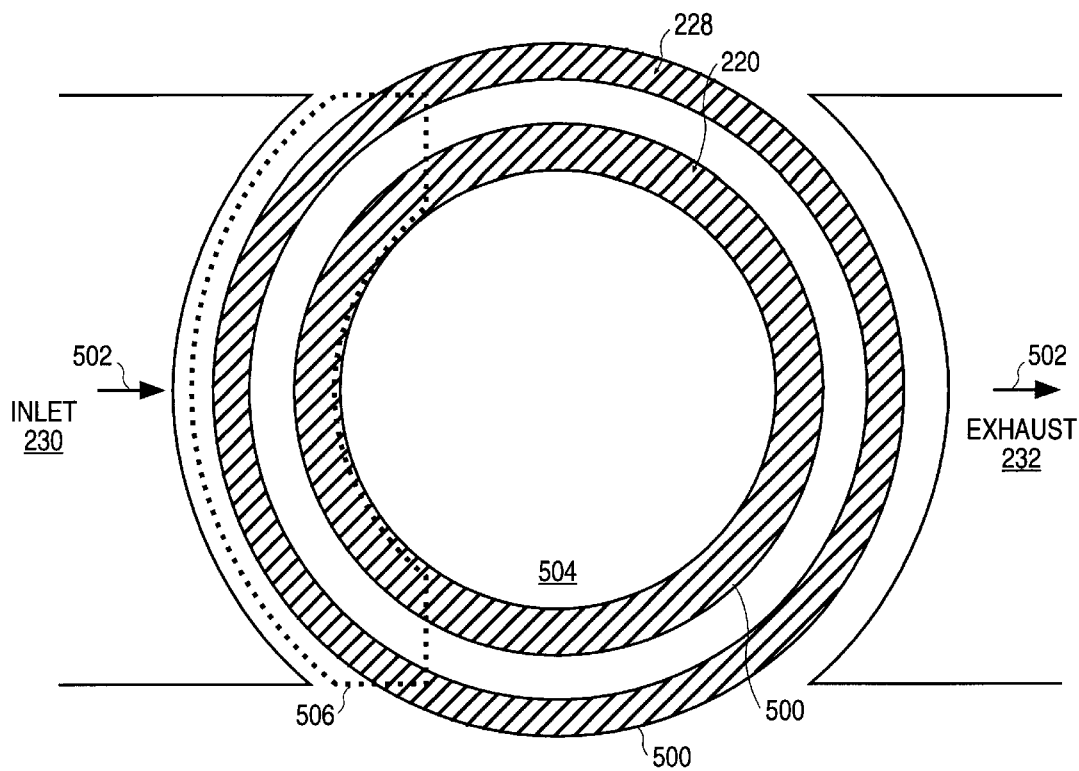
FIG. 5a is an overhead view of a portion of a CVD chamber having a prewafer reaction layer.
Figure 5B:
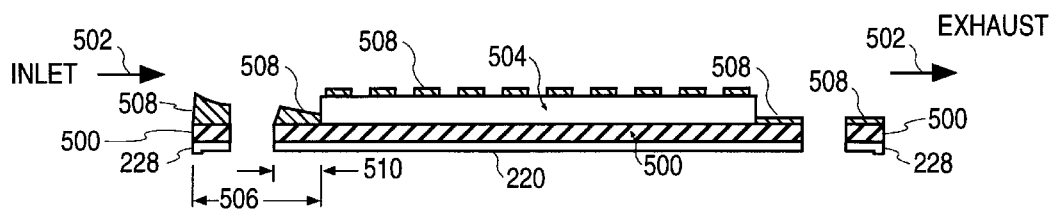
FIG. 5b is a cross section view of a portion of a CVD chamber having a prewafer reaction layer.

A method of selectively depositing a film is illustrated in the flow chart 300 shown in FIG. 3 and shown in FIGS. 5a and 5b. The selective deposition method set forth in FIG. 3 will be described with respect to a preferred selective titanium-silicide deposition process. It is to be appreciated that the present invention is not intended to be limited to this specific embodiment and the present invention is equally applicable to the selective deposition of any film which suffers from "edge effects".

The first step of the selective deposition process of the present invention, as shown in block 302 of FIG. 3, is to clean the chamber. The purpose of the chamber clean is to remove any previous CVD deposits formed on susceptor 220 and preheat ring 228 as well as on chamber sidewalls and windows. A standard insitu cleaning process may be used. For example to remove titanium-silicide deposits HCl can be fed into the chamber at a flow rate of between 1–15 liters while the susceptor is heated to a temperature of between 700–1000° C. with a chamber pressure maintained between 80–600 torr.

Next, as set forth in block 304, a prewafer reaction layer 500 is blanket deposited over susceptor 220 and preheat ring 228. Prewafer reaction layer can be formed of any material which will suitably react with the deposition gas to be used to selectively deposit a film on a wafer or substrate. In the preferred embodiment of the present invention where a titanium-silicide film is to be selectively deposited onto a wafer using titanium-tetrachloride ($TiCl_4$), and a silicon source gas, the prewafer reaction layer 500 can be any silicon layer including, but not limited to amorphous silicon, polycrystalline silicon, (either doped or undoped) or a silicide such as but not limited to titanium-silicide or tungsten silicide. The prewafer reaction layer 500 should be formed thick enough to provide sufficient reactants to produce a stable growth rate at the edge of the wafer. The prewafer reaction layer 500 can have a thickness of between a few hundred angstroms to tens of microns.

Any well known silicon deposition process can be used to form a polycrystalline or amorphous silicon layer for subsequent selective silicide deposition process. For example, preheat ring 228 and susceptor 220 can be deposited with polycrystalline silicon or amorphous silicon by flowing a silicon source gas, such as but not limited to silane ($SiH^4$), dichlorosilane ($SiCl_2H_2$), trichlorosilane ($SiHCl_3$), disilane, and tetrachlorosilane ($SiCl_4$), at a flow rate of between 1–1000 sccm into the process chamber, while maintaining a reaction chamber pressure of between 5–200 torr at a temperature of between 600–900° C. If desired the silicon prewafer reaction layer can be doped with a gas such as phosphine ($PH_3$), diborane ($B_2H_6$), and Arsine ($As_2H_6$).

Next, as set forth in block 306, a substrate 504 is transferred into reaction chamber 212 and placed onto the prewafer reaction layer coated susceptor. In the selective deposition process of the present invention, substrate 504 will have reactive areas which will react with the deposition gas 502 to form films on the reactive areas and will have non-reactive areas which will not react with the deposition gas 502 thereby inhibiting the film growth on the non-reactive areas. Substrate 504 may be any suitable substrate used for any purpose such as but not limited to a silicon substrate used for integrated circuit manufacturing.

Figure 4:
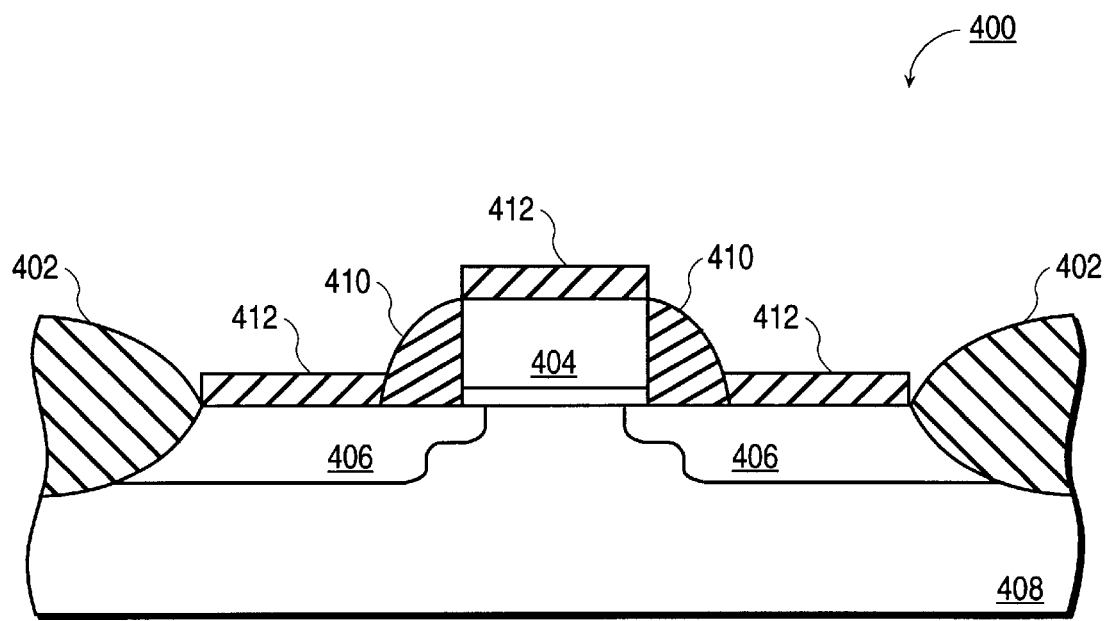
FIG. 4 is an illustration of a cross sectional view of a MOS transistor having selectively deposited silicide.

In the case of the preferred selective titanium-silicide process of the present invention, the substrate may be a silicon wafer 504 having a plurality of active devices formed across its surface. The active devices may be, for example, MOS transistors 400 separated by field isolation regions 402 such as shown in FIG. 4. An MOS transistor 400 typically has a silicon (polysilicon) gate electrode 404 and a pair of source/drain regions 406 formed in a silicon substrate 408. It is generally desirable to reduce the contact resistance of the MOS device by forming a low resistance silicide 412, such as titanium-silicide, on the source/drain regions 406 and on the gate 404. In order to selectively deposit silicide only on the source/drain regions 406 and on the gate electrode 404, deposition gas is chosen which reacts with only exposed silicon surfaces but not with insulating surfaces to selectively deposit silicide on the source/drain regions 406 and on the silicon gate electrode 404. Insulating spacers 410 (typically silicon dioxide or silicon nitride) prevent silicide shorting between gate electrode 404 and source/drain regions 406 while insulating isolation regions 402 prevent shorting between adjacent transistors 400.

Next, as specified in block 308, a deposition gas 502 is fed into reaction chamber 212. A deposition gas is used which will react with prewafer reaction layer and with the reaction areas on the substrate but not with the non reactive areas of the substrate. The deposition gas is fed into chamber 212 in such a manner that it first flows over the prewafer reaction layer prior to reaching the outside diameter of the wafer placed on the susceptor.

In the preferred embodiment of the present invention, as shown in FIGS. 5a and 5b, deposition gas is injected on one side of chamber 212, flows across the prewafer reaction layer on preheat ring 228, and over the prewafer reaction layer on the exposed portion of susceptor 220 (e.g., portion not covered by wafer), and then flows over the wafer and out the exhaust passage located on the opposite side of the gas inlet. In this way, deposition gas 502 first reacts with the prewafer reaction layer 500 to form a film 508 prior to reaching the wafer edge or the outer diameter of the wafer. In this way, the high deposition rate associated with initial reaction surfaces occurs on the prewafer reaction layer on the susceptor and preheat ring as opposed to on the wafer. It is to be appreciated that although the present invention deposits a prewafer reaction layer over the entire susceptor and preheat ring, all that is necessary is that a sufficient amount of prewafer reaction layer 500 be formed on the area 506 located between the gas inlets and the wafer edge in order to stabilize deposition rate. Additionally, although a prewafer coating of the susceptor and preheat ring is utilized in the preferred embodiment of the present invention, a coated preheat ring or susceptor is not necessary as long as a sufficient initial reaction area 506 is provided to stabilize the deposition rate prior to reaching the wafer edge. For example, the exposed susceptor surface may be expanded to provide more exposed surface thereby eliminating the need for a coated preheat ring.

In the preferred selective deposition method of the present invention, the deposition gas 502 comprises titanium chloride ($TiCl_4$), and a silicon source gas such as silane, can be fed into chamber 212 to form a titanium silicide film layer on the prewafer reaction layer and on the silicon containing surfaces of wafer 504. Titanium-chloride ($TiCl_4$) can be fed through a argon bubbler at, for example 18° C., into chamber 212 at a rate of between 1–5 sccm, while a silicon source gas is fed into chamber 212 at a rate of between 5–50 sccm while maintaining a chamber pressure of between 5–80 torr and a wafer temperature of between 650–850° C. It has been found that forming a prewafer reaction layer on a ¾" wide preheat ring and on approximately one inch of the outer diameter of susceptor 220 provides sufficient initial reaction area 506 to stabilize titanium-silicide deposition rate and prevent edge effects.

After the desired amount of film is deposited onto wafer 504, wafer 504 is removed from chamber 212 as set forth in block 310. If no more wafers are to be processed, then the process is complete as set forth in step 312. If additional wafers are to be processed, then the process can be repeated by going back to step 302 as set forth in step 314 and cleaning the preheat ring and susceptor of film deposits and then forming a new prewafer reaction layer prior to depositing a film on a new wafer. Cleaning the chamber after each wafer deposition ensures a consistent deposition environment for each wafer, however, wafer throughput is reduced.

Alternatively, additional wafers can be processed before cleaning the chamber. In such a case, film 508 formed on prewafer reaction layer 500 during the prior deposition would act as the prewafer reaction layer for the subsequent deposition. For example, in the case of the titanium silicide deposition process, the titanium silicide formed on the prewafer reaction layer act as the prewafer reaction layer for a subsequent deposition process. With the preferred titanium silicide process of the present invention, titanium silicide can be deposited on between 2–50 or more wafers prior to cleaning chamber 212. The decision of when to clean the chamber can be based on any criteria including a set number of wafers, or an amount of film deposited on chamber walls, etc. Processing several wafers before cleaning chamber 212 and susceptor 220 substantially improves wafer throughput in the present invention.

Figure 6:
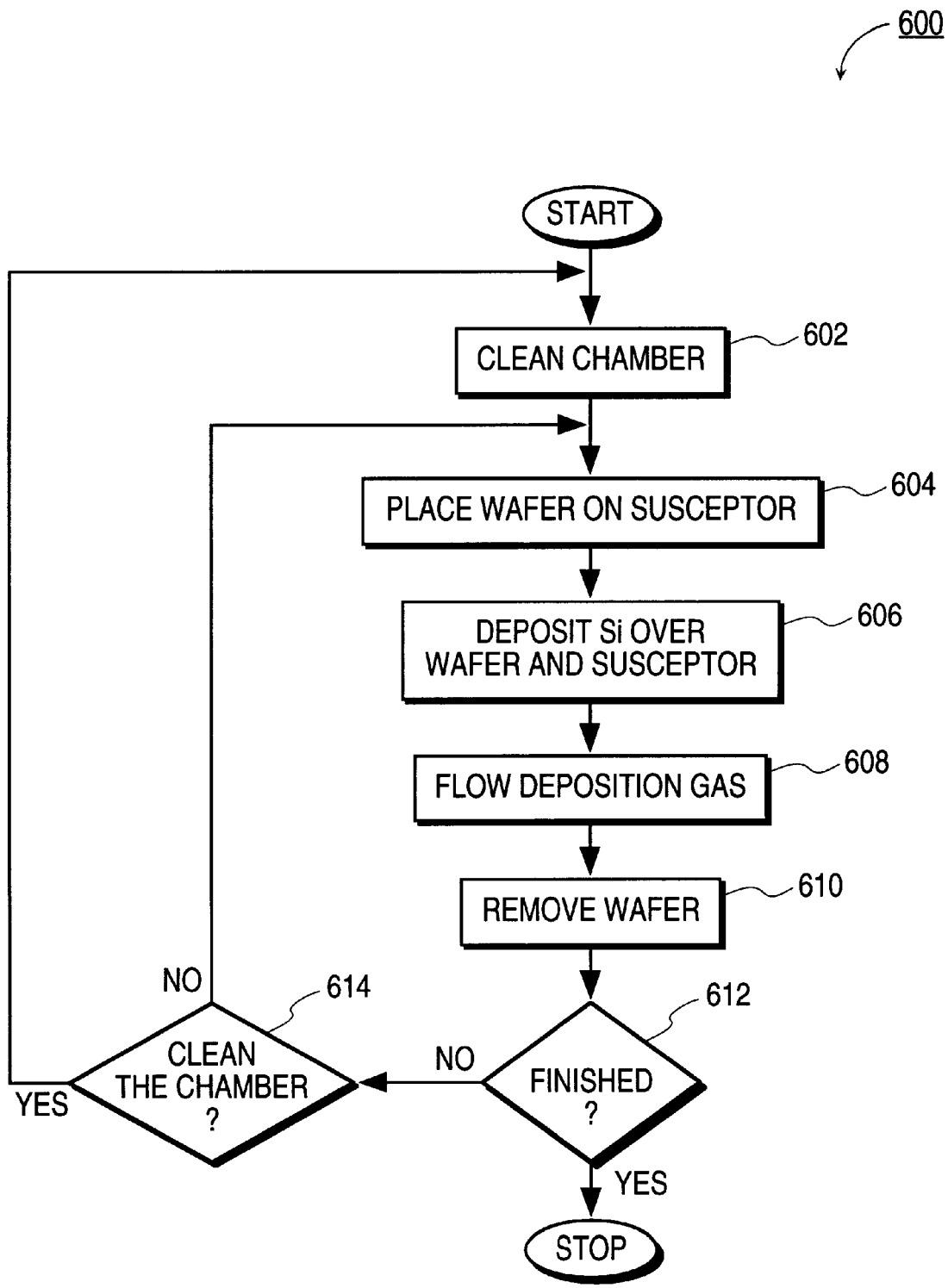
FIG. 6 is a flow chart which illustrates an integrated silicide deposition process in accordance with the present invention.

FIG. 6 shows a flow chart 600 which illustrates an integrated silicide deposition process of the present invention. The integrated silicide deposition process can be used to form, for example, a polysilicon/titanium silicide composite film across an entire surface of a wafer. The polysilicon/titanium silicide composite film can then be patterned by well known photolithography and etching techniques such as reactive ion etching (RIE) into interconnection lines or MOS gate electrodes, etc. of an integrated circuit.

According to the integrated silicide deposition process of the present invention, the first step as set forth in block 602 is to clean the reaction chamber. The purpose of the chamber clean is to remove any previous CVD deposits formed on susceptor 220 in preheat ring 228 as well as chamber sidewalls and windows. A standard insitu cleaning process may be used. For example to remove silicon and titanium silicide deposits HCl can be fed into the chamber at a flow rate of between 1–15 liters while the susceptor is heated to a temperature of between 700–1000° C. with a chamber pressure maintained between 80–600 torr.

Next, as set forth in block 604, a wafer or substrate is moved into chamber 212 and positioned on the substrate placement location on susceptor 220. Substrate 700 is preferably a silicon substrate or wafer but may be any type of substrate onto which a composite film is to be deposited such as those used for integrated circuits. Substrate 700 will typically be covered with an insulating film, such as but not limited to silicon dioxide or silicon nitride, and/or a conducting film such as but not limited to polysilicon, titanium nitride, and tungsten nitride.

Figure 7A:
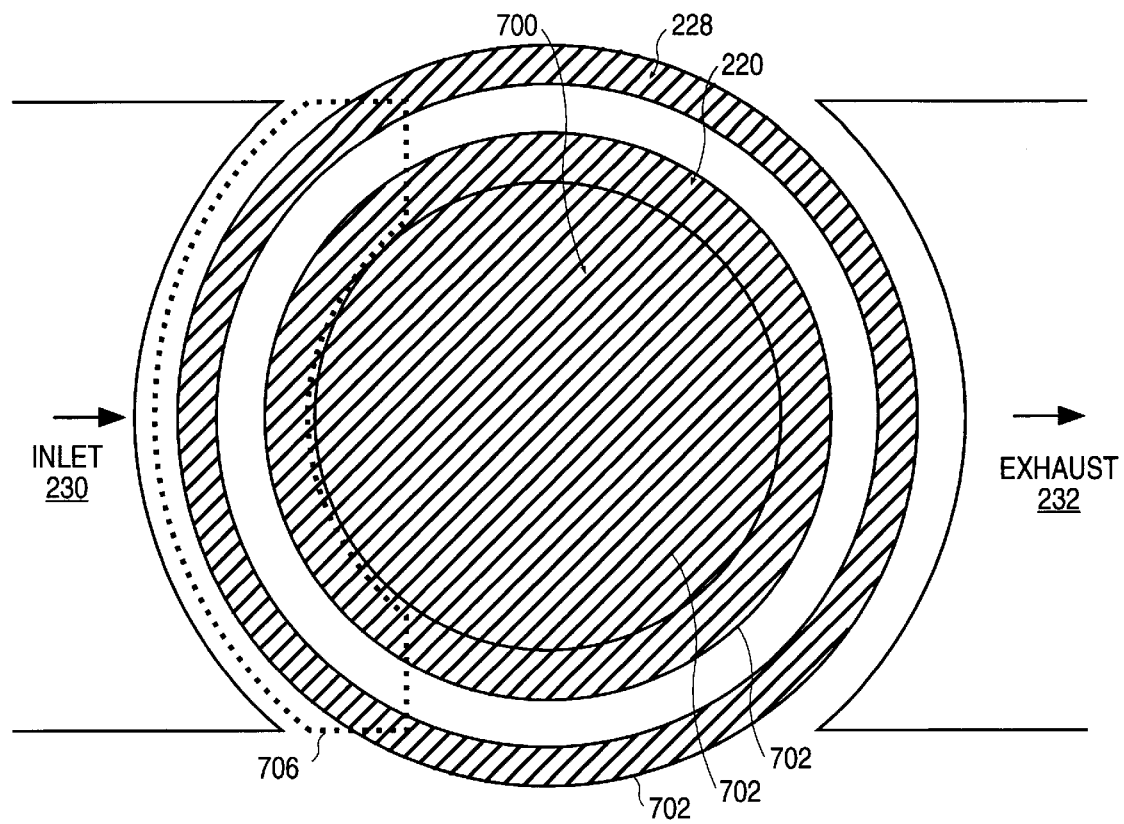
FIG. 7a is an overhead view of a portion of a CVD chamber having a prewafer reaction layer.

Next, as set forth in block 606 and shown in FIG. 7a, a silicon film 702 is blanket deposited over preheat ring 228, uncovered portions of susceptor 220 and the entire surface of substrate 700. The silicon film 702 is deposited to the thickness desired for the features on the wafer. A silicon film can be formed by flowing a silicon source gas, such as but not limited to silane ($SiH_4$) dichlorosilane ($SiCl_2H_2$), trichlorosilane ($SiHCl_3$), disilane, and tetrachlorosilane ($SiCl_4$), at a flow rate of between 10–1000 sccm into process chamber 212 while maintaining the reaction chamber pressure of between 5–200 torr at a temperature of between 600–900° C. If desired, for the features on the silicon wafer, the silicon layer can be insitu doped with a gas or gasses such as phosphine ($PH_3$), diborane ($B_2H_6$), and Arsine ($As_2H_6$).

Figure 7B:
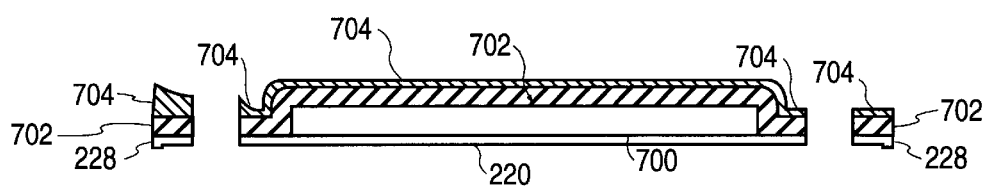
FIG. 7b is a cross section view of a portion of a CVD chamber having a prewafer reaction layer.

Next, as set forth in block 608 and shown in FIG. 7b, deposition gas is fed into chamber 212 to form a silicide film 704 onto silicon film 202 over preheat ring 228, exposed portions of susceptor 220, and wafer 700. The deposition gas is fed into chamber 212 in such a manner that the deposition gas first flows over silicon layer 702 formed on preheat ring 228 and exposed portions of susceptor 220 prior to reaching the edge of wafer 700. That is, deposition is fed into chamber 212 in such a manner that the initial deposition first occurs on the silicon coated preheat ring and susceptor before deposition on the wafer. In this way edge effects are substantially reduced and uniform silicide deposition occurs across the surface of wafer 700. In the integrated deposition method of the present invention, the initial silicon deposition for the silicon wafer is utilized to form the prewafer reaction layer on the preheat ring and susceptor. As described with the earlier method sufficient prewafer reaction area 706 must be provided to stabilize the deposition rate prior to reaching the wafer edge.

In the preferred embodiment of the present invention the silicide film is titanium-silicide. A titanium-silicide film can be formed from a deposition gas comprising titanium chloride and a silicon source gas. For example, titanium chloride can be fed through an argon bubbler at for example 18° C. into chamber 212 at a rate of between 1–5 sccm's while a silicon source gas is fed into chamber 212 at a rate of between 5–50 while maintaining a chamber pressure of between 5–80 torr and a wafer temperature of between 650–850° C. It has been found that forming a silicon layer on a ¾" wide preheat ring and on approximately one inch of the susceptor provides sufficient initial reaction area 706 to stabilize titanium-silicide deposition rate and prevent edge effects.

After the amount of silicide desired for wafer 700 is deposited, the wafer is removed from chamber 212 as set forth in block 610. If no more wafers are to be processed, then the process is complete. If additional wafers are to be processed, the process can be repeated by either returning to step 602 and cleaning the chamber as set forth in block 602 and repeating steps 612 or by not cleaning the chamber and immediately processing a second wafer by starting at block 604.

Thus, a method and apparatus for preventing "edge effects" in a CVD deposition process has been described.

We claim:

1. A method of forming a film on a substrate, said method comprising the steps of:

forming a first layer comprising silicon or a silicide adjacent to a substrate support location on a susceptor located within a deposition chamber having a dome and a heating lamp wherein said dome is transparent to radiation emitted from said heating lamp and wherein said susceptor is opaque to radiation emitted from said heating lamp; and flowing a deposition gas over said first layer to deposit said film on said first layer and then over an outer diameter of said substrate to deposit said film on said substrate.

2. The method of claim 1 wherein said first layer is a silicon layer.

3. The method of claim 2 wherein said silicon layer is an amorphous silicon layer.

4. The method of claim 2 wherein said silicon layer is a polycrystalline silicon layer.

5. The method of claim 1 wherein said first layer is a titanium silicide layer.

6. The method of claim 1 wherein said film is A titanium silicide film.

7. A method of depositing a film on a substrate, said method comprising the steps of:

depositing a first layer comprising silicon or a silicide onto a susceptor to form a first layer coated susceptor within a deposition chamber having a dome and a heating lamp wherein said dome is transparent to radiation emitted from said heating lamp and wherein the susceptor is opaque to radiation emitted from said heating lamp;

placing a substrate horizontally onto said first layer coated susceptor; and flowing a deposition gas over said first layer coated susceptor so that said deposition gas reacts first with said first layer coated susceptor to form said film on said first layer coated susceptor prior to reacting with said substrate to form a film on said substrate.

8. The method of claim 7 wherein said first layer is a silicon layer.

9. The method of claim 7 wherein said first layer is polycrystalline silicon layer.

10. The method of claim 7 wherein said first layer is an amorphous silicon layer.

11. The method of claim 7 wherein said first layer is a titanium silicide layer.

12. The method of claim 7 wherein said first layer and said film on said substrate are the same material.

13. A method of selectively depositing a titanium silicide layer on silicon areas of a wafer, said method comprising the steps of:

a) depositing a silicon layer onto a susceptor to form a silicon coated susceptor;

b) placing a wafer having a silicon containing surface and an insulating surface horizontally on said silicon coated susceptor; and c) flowing a titanium containing deposition gas over said silicon coated susceptor and reacting said titanium containing deposition gas with said silicon coated susceptor prior to flowing said titanium containing deposition gas over said silicon containing surface of said wafer to selectively form titanium-silicide on silicon areas of said wafer.

14. The method of claim 13 further comprising the step of:

prior to depositing said silicon layer cleaning said susceptor.

15. The method of claim 13 further comprising the steps of:

repeating steps b) and c) a plurality of times; and after repeating steps b) and c) a plurality of times, removing said titanium-silicide from said susceptor and said preheat ring.

16. The method of claim 13 wherein said silicon layer is a polycrystalline silicon layer.

17. The method of claim 13 wherein said titanium containing deposition gas comprises titanium tetrachloride (TiCl$_4$).

18. A method of forming a film on a substrate comprising the steps of:

placing a first substrate on a susceptor in a chamber having a dome and a heating lamp wherein said dome is transparent to radiation emitted from said heating lamp and wherein said susceptor is opaque to radiation emitted from said heating lamp;

depositing a silicon film over said susceptor and over said substrate to form a silicon coated susceptor and substrate;

flowing a silicide deposition gas into said chamber in such a manner that said silicide deposition gas flows over said silicon coated susceptor prior to reaching said silicon coated substrate; and forming a silicide on said silicon coated susceptor and on said silicon coated substrate.

19. The method of claim 18 further comprising the step of:

placing a second substrate on said susceptor;

depositing a second silicon film over said silicide layer on said susceptor and over said second substrate; and depositing a second silicide film on said second silicon film.

20. The method of claim 18 wherein said silicide film is a titanium silicide film.

* * * * *